(12) United States Patent
Liu et al.

(10) Patent No.: US 11,735,400 B2
(45) Date of Patent: Aug. 22, 2023

(54) FARADAY CLEANING DEVICE AND PLASMA PROCESSING SYSTEM

(71) Applicant: JIANGSU LEUVEN INSTRUMENTS CO., LTD, Jiangsu (CN)

(72) Inventors: Haiyang Liu, Jiangsu (CN); Dongdong Hu, Jiangsu (CN); Xiaobo Liu, Jiangsu (CN); Na Li, Jiangsu (CN); Shiran Cheng, Jiangsu (CN); Song Guo, Jiangsu (CN); Zhihao Wu, Jiangsu (CN); Kaidong Xu, Jiangsu (CN)

(73) Assignee: JIANGSU LEUVEN INSTRUMENTS CO., LTD, Jiangsu (CN)

( * ) Notice: Subject to any disclaimer, the term of this patent is extended or adjusted under 35 U.S.C. 154(b) by 0 days.

(21) Appl. No.: 17/627,129

(22) PCT Filed: Feb. 26, 2020

(86) PCT No.: PCT/CN2020/076761
§ 371 (c)(1),
(2) Date: Jan. 14, 2022

(87) PCT Pub. No.: WO2021/036214
PCT Pub. Date: Mar. 4, 2021

(65) Prior Publication Data
US 2022/0375733 A1    Nov. 24, 2022

(30) Foreign Application Priority Data
Aug. 23, 2019   (CN) .......................... 201910783185.0

(51) Int. Cl.
*H01J 37/32* (2006.01)
(52) U.S. Cl.
CPC . *H01J 37/32862* (2013.01); *H01J 2237/3341* (2013.01)

(58) Field of Classification Search
CPC ......... H01J 37/32862; H01J 2237/3341; H01J 37/32853; H01J 2237/334
See application file for complete search history.

(56) References Cited

U.S. PATENT DOCUMENTS

| 7,833,429 B2 | 11/2010 | Nishio et al. |
| 2002/0129903 A1 * | 9/2002 | Davis ................ H01J 37/32082 156/345.48 |

(Continued)

FOREIGN PATENT DOCUMENTS

| CN | 1503856 | 6/2004 |
| CN | 106469636 | 3/2017 |

(Continued)

OTHER PUBLICATIONS

"International Search Report (Form PCT/ISA/210) of PCT/CN2020/076761," dated May 25, 2020, with English translation thereof, pp. 1-4.

(Continued)

*Primary Examiner* — Erin F Bergner
(74) *Attorney, Agent, or Firm* — JCIPRNET

(57) ABSTRACT

Provided are a faraday cleaning device and a plasma processing system, the device comprising a reaction chamber, a bias electrode, a wafer, a chamber cover, a coupling window, an air inlet nozzle, a vertical coil, and a faraday layer, wherein the coupling window is installed at the upper end face of the chamber cover, the chamber cover is installed at the upper end face of the reaction chamber, the bias electrode is assembled inside the reaction chamber, the wafer is installed at the upper end face of the bias electrode, the air inlet nozzle is assembled inside the coupling window, the faraday layer is installed at the upper end face of the coupling window, and the vertical coil is assembled at the upper end face of the faraday layer.

6 Claims, 8 Drawing Sheets

(56) References Cited

U.S. PATENT DOCUMENTS

| | | | |
|---|---|---|---|
| 2013/0186568 A1* | 7/2013 | Long ...................... | H05K 9/00 |
| | | | 156/345.48 |
| 2016/0118284 A1* | 4/2016 | Iwai .................. | H01J 37/32522 |
| | | | 361/234 |
| 2017/0053782 A1* | 2/2017 | O'Neill .............. | H01J 37/32119 |

FOREIGN PATENT DOCUMENTS

| | | |
|---|---|---|
| CN | 110491760 | 11/2019 |
| JP | 2014154421 | 8/2014 |
| JP | 2018014337 | 1/2018 |
| TW | 201432777 | 8/2014 |

OTHER PUBLICATIONS

"Written Opinion of the International Searching Authority (Form PCT/ISA/237) of PCT/CN2020/076761," dated May 25, 2020, pp. 1-5.

\* cited by examiner

FARADAY CLEANING DEVICE AND PLASMA PROCESSING SYSTEM

CROSS-REFERENCE TO RELATED APPLICATION

This application is a 371 of international application of PCT application serial no. PCT/CN2020/076761, filed on Feb. 26, 2020, which claims the priority benefit of China application no. 201910783185.0, filed on Aug. 23, 2019. The entirety of each of the above mentioned patent applications is hereby incorporated by reference herein and made a part of this specification.

TECHNICAL FIELD

The present invention relates to the technical field of plasma cleaning devices, and in particular, to a faraday cleaning device and a plasma processing system.

DESCRIPTION OF RELATED ART

In the semiconductor integrated circuit manufacturing process, etching is one of the most important processes, and plasma etching is one of the commonly used etching methods. Etching usually occurs in a vacuum reaction chamber. The vacuum reaction chamber usually includes an electrostatic adsorption chuck, for adsorption wafer carrying, radio frequency loading, and wafer cooling. During the plasma etching, a faraday cleaning device and a plasma processing system are required.

In the prior art, the existing faraday cleaning device and plasma processing system are ineffective in use due to incomplete cleaning. Therefore, there is an urgent need for a faraday cleaning device and a plasma processing system to resolve the foregoing problem.

SUMMARY

In view of the disadvantage of the prior art, an objective of the present invention is to provide a faraday cleaning device and a plasma processing system to resolve the problem raised in the background. The present invention has an appropriate structure, is easy to assemble, provides a favorable cleaning effect, and is highly practical.

To achieve the foregoing objective, the present invention is implemented through the following technical solutions: a faraday cleaning device and a plasma processing system, including a reaction chamber, a bias electrode, a wafer, a chamber cover, and an easy-to-clean mechanism, where: the chamber cover is mounted on an upper end face of the reaction chamber, the bias electrode is mounted inside the reaction chamber, the wafer is mounted on an upper end face of the bias electrode, and the easy-to-clean mechanism is provided on an upper side of the chamber cover; and the easy-to-clean mechanism includes a coupling window, an air inlet nozzle, a vertical coil, and a faraday layer, the coupling window is mounted on an upper end face of the chamber cover, the air inlet nozzle is mounted inside the coupling window, the faraday layer is mounted on an upper end face of the coupling window, and the vertical coil is mounted on an upper end face of the faraday layer.

Further, the faraday layer comprises a two-stage faraday and a three-stage faraday.

Further, the two-stage faraday includes a center faraday, a edge faraday, a faraday capacitor, and a faraday electrode sheet, an outermost diameter of the two-stage faraday is 0% to 10% greater than a maximum diameter of the coupling window exposed in the chamber cover, a maximum diameter of the center faraday accounts for 40% to 65% of the two-stage faraday, and the faraday electrode sheet of the two-stage faraday has a size consistent with a size of the faraday capacitor and a thickness consistent with a thickness of each of the center faraday and the edge faraday.

Further, a thickness of the faraday capacitor, a size of a superimposed part of the center faraday and the edge faraday, and an intermediate gap between the center faraday and the edge faraday may be adjusted as required, and for a specific adjustment and calculation manner, reference may be made to the following capacitance calculation formula: $C=\varepsilon S/4\pi kd$, where $\varepsilon$ is a constant, S is a facing area of a capacitor plate, d is a distance of the capacitor plate, and k is an electrostatic force constant; and for a common parallel plate capacitor, a capacitance is $C=\varepsilon S/d$ (where $\varepsilon$ is a dielectric constant of a dielectric between plates, S is a plate area, and d is a distance between the plates).

Further, the center faraday of the two-stage faraday consists of two identical sets of sector conductive members, there is a gap between the sector conductive members, the sector conductive members each include a conductive ring and petal-like assemblies with a gap therebetween, the petal-like assemblies are isolated from each other, the petal-like assemblies are uniformly distributed and rotationally symmetrical about a vertical axis, and the gaps between the petal-like assemblies are of a same shape and size.

Further, the three-stage faraday includes an internal faraday, a central faraday, an external faraday, an internal capacitor, an internal electrode sheet, an external capacitor, and an external electrode sheet, an outermost diameter of the three-stage faraday is 0% to 10% greater than a maximum diameter of the coupling window exposed in the chamber cover, a maximum diameter of the internal faraday accounts for 15% to 35% of the three-stage faraday, a range of the central faraday accounts for 15% to 35% of the three-stage faraday, and the internal electrode sheet and the external electrode sheet of the three-stage faraday have sizes respectively consistent with sizes of the internal capacitor and the external capacitor and thicknesses consistent with thicknesses of the internal faraday, the central faraday, and the external faraday.

Further, thicknesses of the internal capacitor and the external capacitor, and a size of a superimposed part with each of the internal faraday, the central faraday, and the external faraday, gaps between the internal faraday, the central faraday, and the external faraday may be adjusted as required, and for a specific adjustment and calculation manner, reference may be made to the following capacitor calculation formula: $C=\varepsilon S/4\pi kd$, where $\varepsilon$ is a constant, S is a facing area of a capacitor plate, d is a distance of the capacitor plate, and k is an electrostatic force constant; and for a common parallel plate capacitor, a capacitance is $C=\varepsilon S/d$ (where $\varepsilon$ is a dielectric constant of a dielectric between plates, S is a plate area, and d is a distance between the plates).

The present invention has the following beneficial effects: In the faraday cleaning device and the plasma processing system of the present invention, because the coupling window, the air inlet nozzle, the vertical coil, and the faraday layer are added to the present invention, the design helps clean the interior of the reaction chamber, thereby resolving the problem of poor usage effect of the original faraday cleaning device and plasma processing system, and making the present invention more practicable.

As the faraday layer comprises a two-stage faraday and a three-stage faraday, the design is more appropriate. As the two-stage faraday includes center faraday, edge faraday, a faraday capacitor, and a faraday electrode sheet, an outermost diameter of the two-stage faraday is 0% to 10% greater than a maximum diameter of the coupling window exposed in the chamber cover, a maximum diameter of the center faraday accounts for 40% to 65% of the two-stage faraday, and the faraday electrode sheet of the two-stage faraday has a size consistent with a size of the faraday capacitor and a thickness consistent with a thickness of each of the center faraday and the edge faraday. The present invention has an appropriate structure, is easy to assemble, provides a favorable cleaning effect, and is highly practical.

BRIEF DESCRIPTION OF THE DRAWINGS

Other features, objectives, and advantages of the present invention will become more apparent by reading the detailed description of non-limiting embodiments made with reference to the following drawings.

Figure 1:
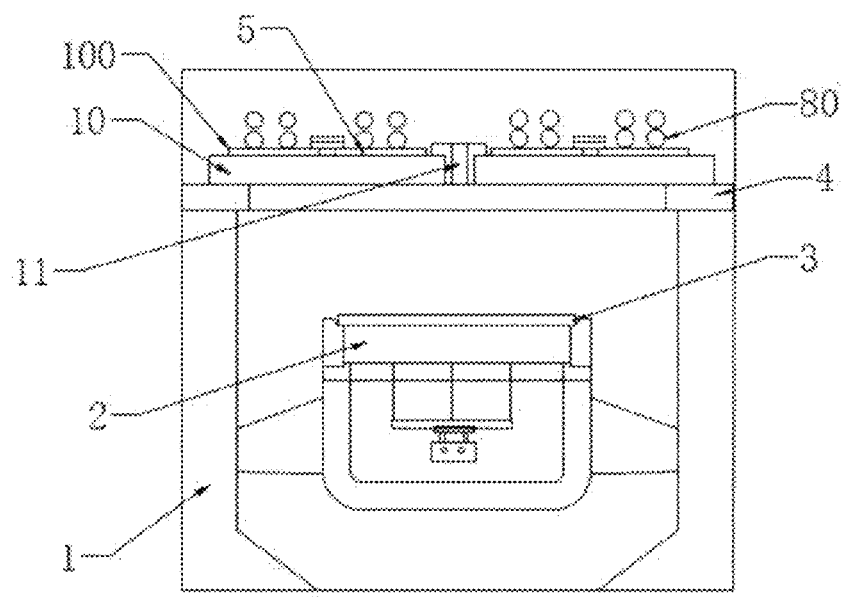
FIG. 1 is a schematic structural diagram of a faraday cleaning device and a plasma processing system according to the present invention.
Figure 2:
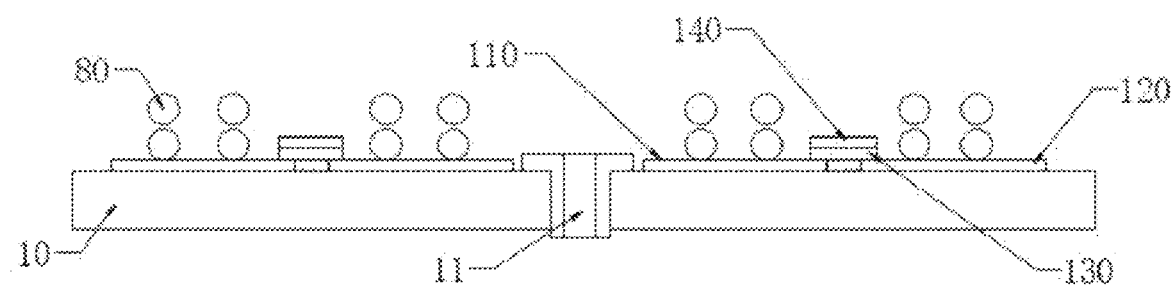
FIG. 2 is a cross-sectional view of a two-stage faraday structure in a faraday cleaning device and a plasma processing system according to the present invention.
Figure 3:
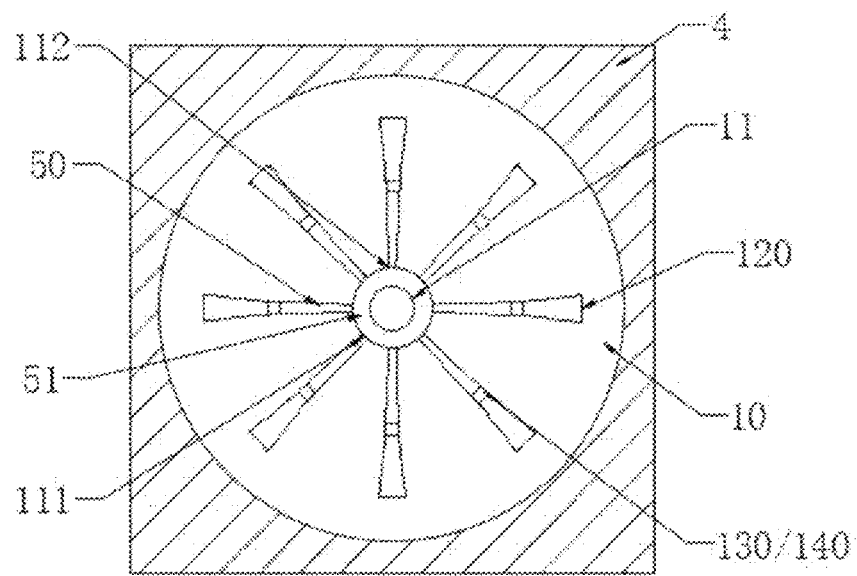
FIG. 3 is a top view of a two-stage faraday structure in a faraday cleaning device and a plasma processing system according to the present invention.
Figure 4:
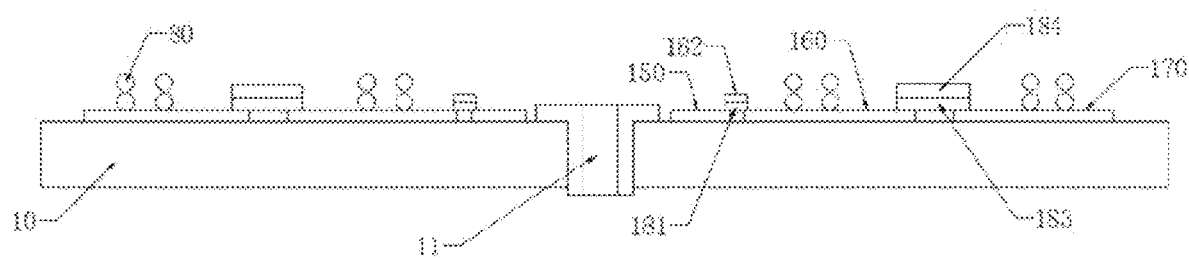
FIG. 4 is a cross-sectional view of a three-stage faraday structure in a faraday cleaning device and a plasma processing system according to the present invention.
Figure 5:
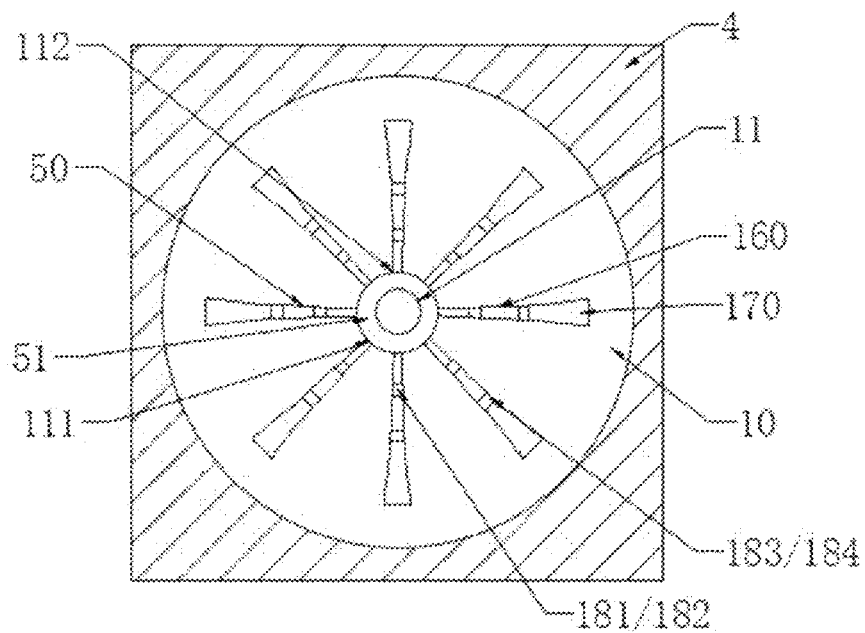
FIG. 5 is a top view of a three-stage faraday structure in a faraday cleaning device and a plasma processing system according to the present invention.

In the figures: 1—reaction chamber, 2—bias electrode, 3—wafer, 4—chamber cover, 5—easy-to-clean mechanism, 10—coupling window, 11—air inlet nozzle, 80—vertical coil, 100—faraday layer, 110—center faraday, 120—edge faraday, 130—faraday capacitor, 140—faraday electrode sheet, 50—conductive ring, 51—petal assembly, 150—internal faraday, 160—central faraday, 170—external faraday, 181—internal capacitor, 182—internal electrode sheet, 183—external capacitor, 184—external electrode sheet.

DESCRIPTION OF THE EMBODIMENTS

In order to make the technical means, creative features, objectives to be achieved, and efficacy of the present invention easy to understand, the present invention is further elaborated below with reference to specific implementations.

Referring to FIG. 1 to FIG. 11, the present invention provides a technical solution: a faraday cleaning device and a plasma processing system, including a reaction chamber 1, a bias electrode 2, a wafer 3, a chamber cover 4, and an easy-to-clean mechanism 5. The chamber cover 4 is mounted on an upper end face of the reaction chamber 1. The bias electrode 2 is mounted inside the reaction chamber 1. The wafer 3 is mounted on an upper end face of the bias electrode 2. The easy-to-clean mechanism 5 is provided on an upper side of the chamber cover 4.

The easy-to-clean mechanism 5 includes a coupling window 10, an air inlet nozzle 11, a vertical coil 80, and a faraday layer 100. The coupling window 10 is mounted on an upper end face of the chamber cover 4. The air inlet nozzle 11 is mounted inside the coupling window 10. The faraday layer 100 is mounted on an upper end face of the coupling window 10. The vertical coil 80 is mounted on an upper end face of the faraday layer 100. Because the coupling window 10, the air inlet nozzle 11, the vertical coil 80, and the faraday layer 100 are added to the present invention, the design resolves the problem of poor usage effect of the original faraday cleaning device and plasma processing system.

The faraday layer 100 comprises a two-stage faraday and a three-stage faraday, such that the design is more appropriate. The two-stage faraday includes center faraday 110, edge faraday 120, a faraday capacitor 130, and a faraday electrode sheet 140. An outermost diameter of the two-stage faraday is 0% to 10% greater than a maximum diameter of the coupling window 10 exposed in the chamber cover 4. A maximum diameter of the center faraday 110 accounts for 40% to 65% of the two-stage faraday. The faraday electrode sheet 140 of the two-stage faraday has a size consistent with a size of the faraday capacitor 130 and a thickness consistent with a thickness of each of the center faraday 110 and the edge faraday 120.

A thickness of the faraday capacitor 130, a size of a superimposed part of the center faraday 110 and the edge faraday 120, and an intermediate gap between the center faraday 110 and the edge faraday 120 may be adjusted as required. For a specific adjustment and calculation manner, reference may be made to the following capacitance calculation formula: $C=\varepsilon S/4\pi kd$, where $\varepsilon$ is a constant, S is a facing area of a capacitor plate, d is a distance of the capacitor plate, and k is an electrostatic force constant. For a common parallel plate capacitor, a capacitance is $C=\varepsilon S/d$ (where $\varepsilon$ is a dielectric constant of a dielectric between plates, S is a plate area, and d is a distance between the plates). The design facilitates calculation and adjustment of a gap at a joint.

The center faraday 110 of the two-stage faraday consists of two identical sets of sector conductive members 111 and 112. There is a gap between the sector conductive members 111 and 112. The sector conductive members 111 and 112 each include a conductive ring 51 and petal-like assemblies 50 with a gap therebetween, and the petal-like assemblies 50 are isolated from each other. The petal-like assemblies 50 are uniformly distributed and rotationally symmetrical about a vertical axis. The gaps between the petal-like assemblies 50 are of a same shape and size. The design facilitates cleaning of the center of the coupling window 10.

The three-stage faraday includes an internal faraday 150, a central faraday 160, an external faraday 170, an internal capacitor 181, an internal electrode sheet 182, an external capacitor 183, and an external electrode sheet 184. An outermost diameter of the three-stage faraday is 0% to 10% greater than a maximum diameter of the coupling window 10 exposed in the chamber cover 4. A maximum diameter of the internal faraday 150 accounts for 15% to 35% of the three-stage faraday. A range of the central faraday 160 accounts for 15% to 35% of the three-stage faraday. The internal electrode sheet 182 and the external electrode sheet 184 of the three-stage faraday have sizes respectively consistent with sizes of the internal capacitor 181 and the external capacitor 183 and thicknesses consistent with thicknesses of the internal faraday 150, the central faraday 160, and the external faraday 170.

The thicknesses of the internal capacitor 181 and the external capacitor 183, and a size of a superimposed part with each of the internal faraday 150, the central faraday 160, and the external faraday 170, gaps between the internal faraday 150, the central faraday 160, and the external faraday 170 may be adjusted as required. For a specific adjustment and calculation manner, reference may be made to the following capacitor calculation formula: $C=\varepsilon S/4\pi kd$, where $\varepsilon$ is a constant, S is a facing area of a capacitor plate, d is a distance of the capacitor plate, and k is an electrostatic force constant. For a common parallel plate capacitor, a capacitance is $C=\varepsilon S/d$ (where $\varepsilon$ is a dielectric constant of a dielectric between plates, S is a plate area, and d is a distance between the plates). The design facilitates calculation and adjustment of a gap at a joint.

Figure 6:
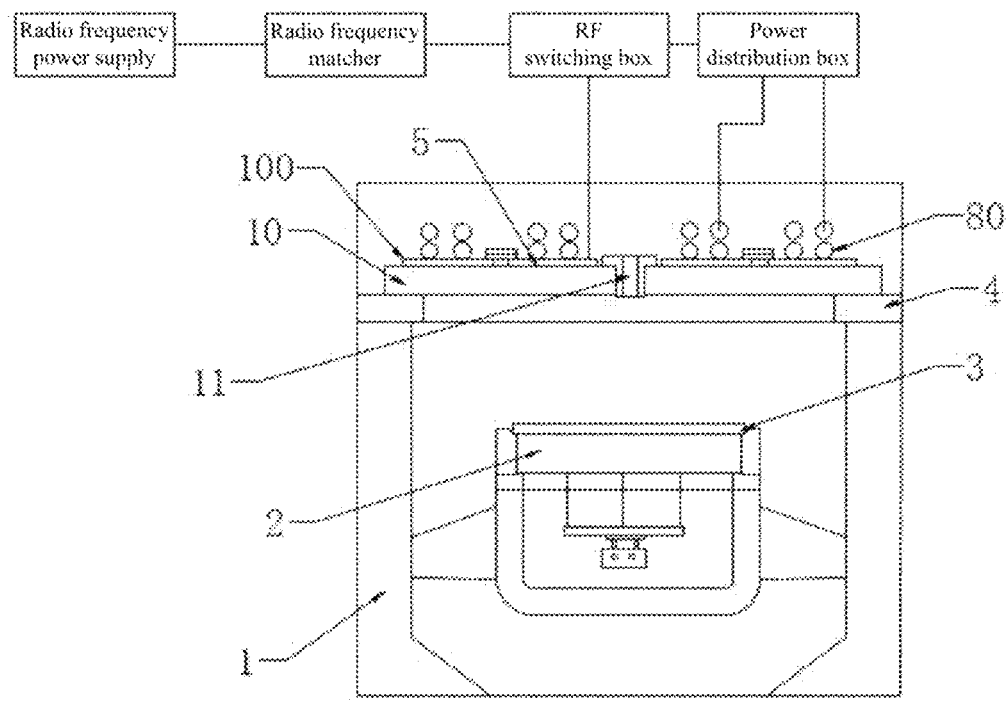
FIG. 6 is a schematic diagram of a first implementation in a faraday cleaning device and a plasma processing system according to the present invention.
Figure 7:
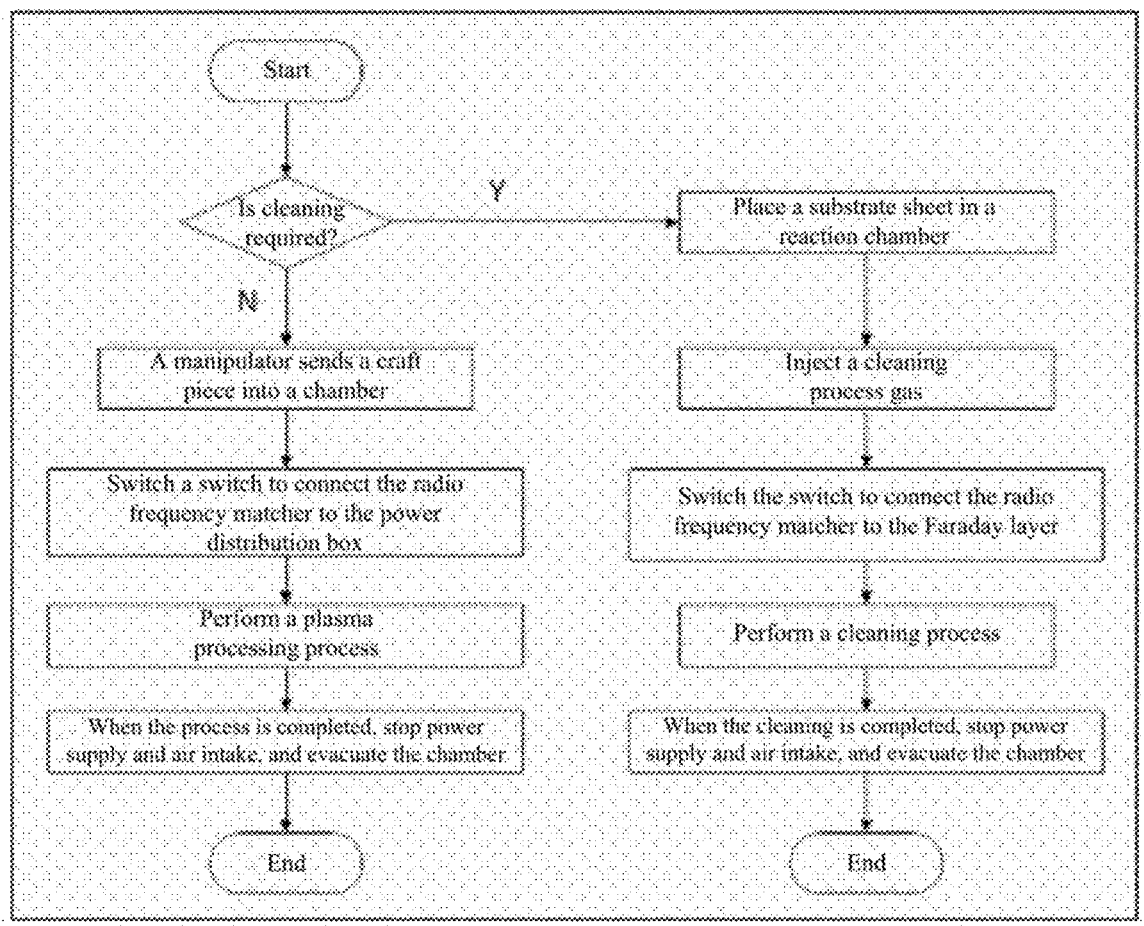
FIG. 7 is a working flowchart of a first implementation in a faraday cleaning device and a plasma processing system according to the present invention.

In an embodiment of the present invention: A first implementation is shown in FIG. 6: Two single vertical coils of two independent parts at the center and edge of the vertical coil 80 each have one end connected together to an external radio frequency device and the other end also connected together to the ground. Non-grounded ends of inner and outer coils are both connected to a power distribution box of a radio frequency matcher. The power distribution box sets power to be distributed to the center and the edge, to adjust the power of the center and the edge according to different process requirements, so as to adjust density of plasma in the chamber. An RF switching box is further provided between the radio frequency matcher and the power distribution box. Two paths are connected from the RF switching box, one path is connected to the power distribution box, and the other path is connected to the faraday layer 100. When the device is ready for a process, the RF switching box loads all output power of the radio frequency matcher into the power distribution box, and there is no power on the faraday layer 100. Then the power distribution box distributes power to the coils at the center and edge as required. When the process ends and chamber cleaning starts, the RF switching box loads all power to the faraday layer 100, and power of each of the inner coil and the outer coil is zero. In this case, the chamber is cleaned, and the coupling window 10 is completely cleaned, to reduce deposition of non-volatile metal particles on the top. A working procedure of this implementation is shown in FIG. 7.

Figure 8:
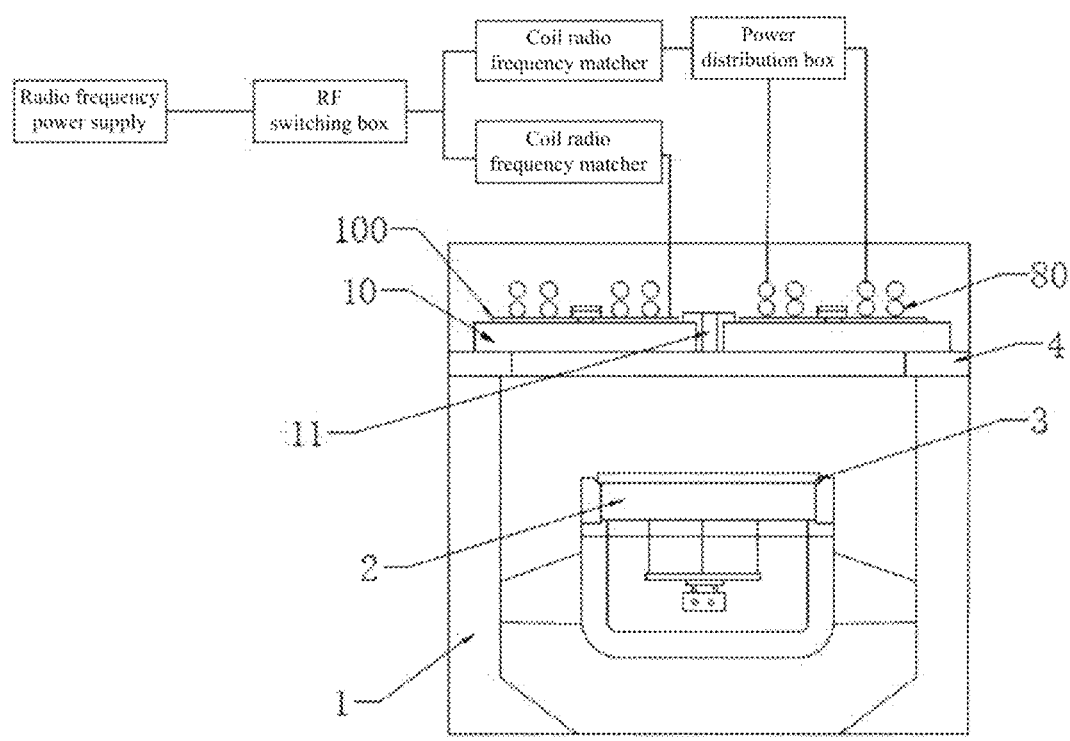
FIG. 8 is a schematic diagram of a second implementation in a faraday cleaning device and a plasma processing system according to the present invention.
Figure 9:
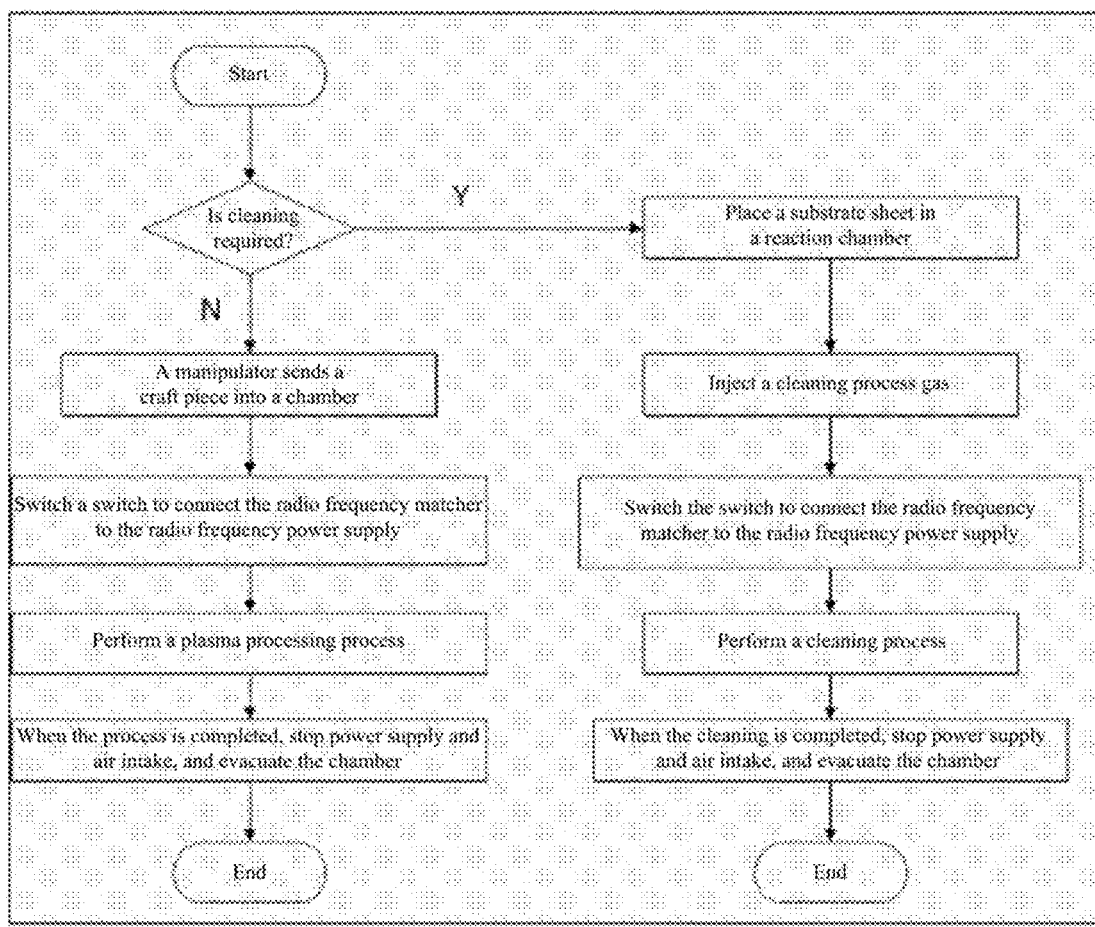
FIG. 9 is a working flowchart of a second implementation in a faraday cleaning device and a plasma processing system according to the present invention.

A second implementation of the present invention is shown in FIG. 8. A process and cleaning flowchart of this implementation is shown in FIG. 9. Two radio frequency matchers are configured, one matcher is used to load radio frequency power to the faraday layer, and the other is used to load radio frequency power to the inner and outer coils. The two radio frequency matchers are controlled by one radio frequency power supply, and an RF switching box is used between the radio frequency power supply and the radio frequency matcher to control which matcher starts working. When the process starts in the chamber, the RF switching box connects the radio frequency power supply to the coil radio frequency matcher, and the faraday radio frequency matcher is not powered on. Power from the coil matcher is loaded into the coils at the center and the edge through the power distribution box, ionizing a process gas in the chamber to form a plasma etching process sheet. When the process ends, cleaning of the chamber starts, the RF switching box connects the radio frequency power supply to the faraday radio frequency matcher, and the coil matcher is not powered on. All power from the faraday matcher is loaded to the faraday layer 100, ionizing a cleaning gas in the upper part of the chamber to form active plasma to completely clean the reaction chamber 1, especially a lower surface of the coupling window 10.

Figure 10:
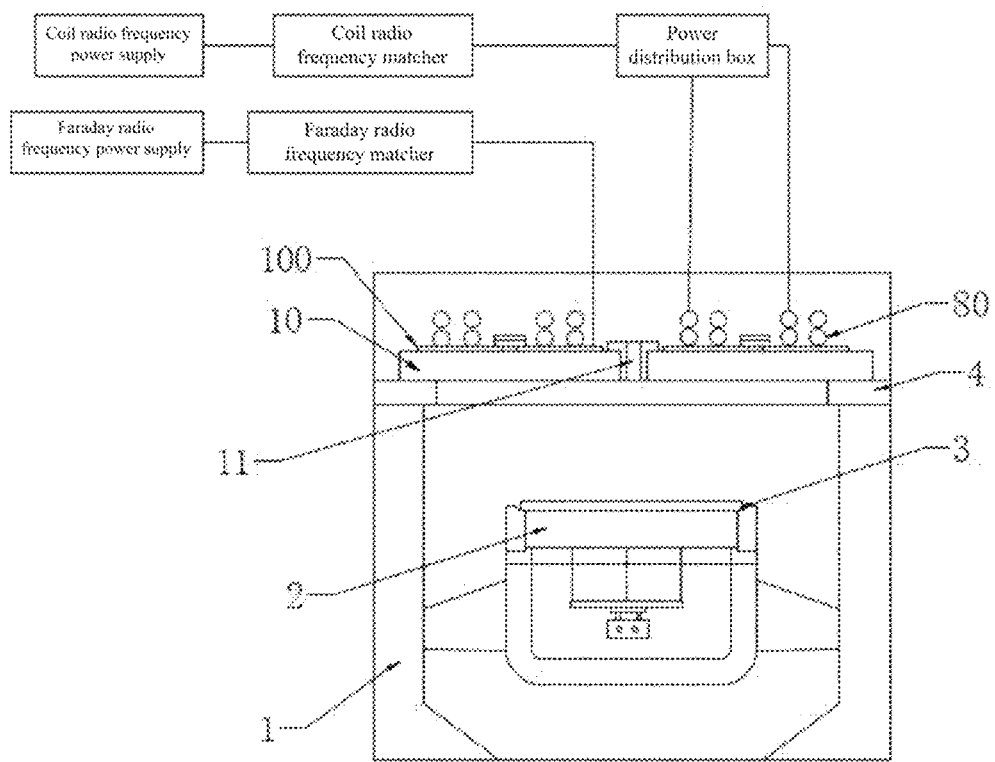
FIG. 10 is a schematic diagram of a third implementation in a faraday cleaning device and a plasma processing system according to the present invention.
Figure 11:
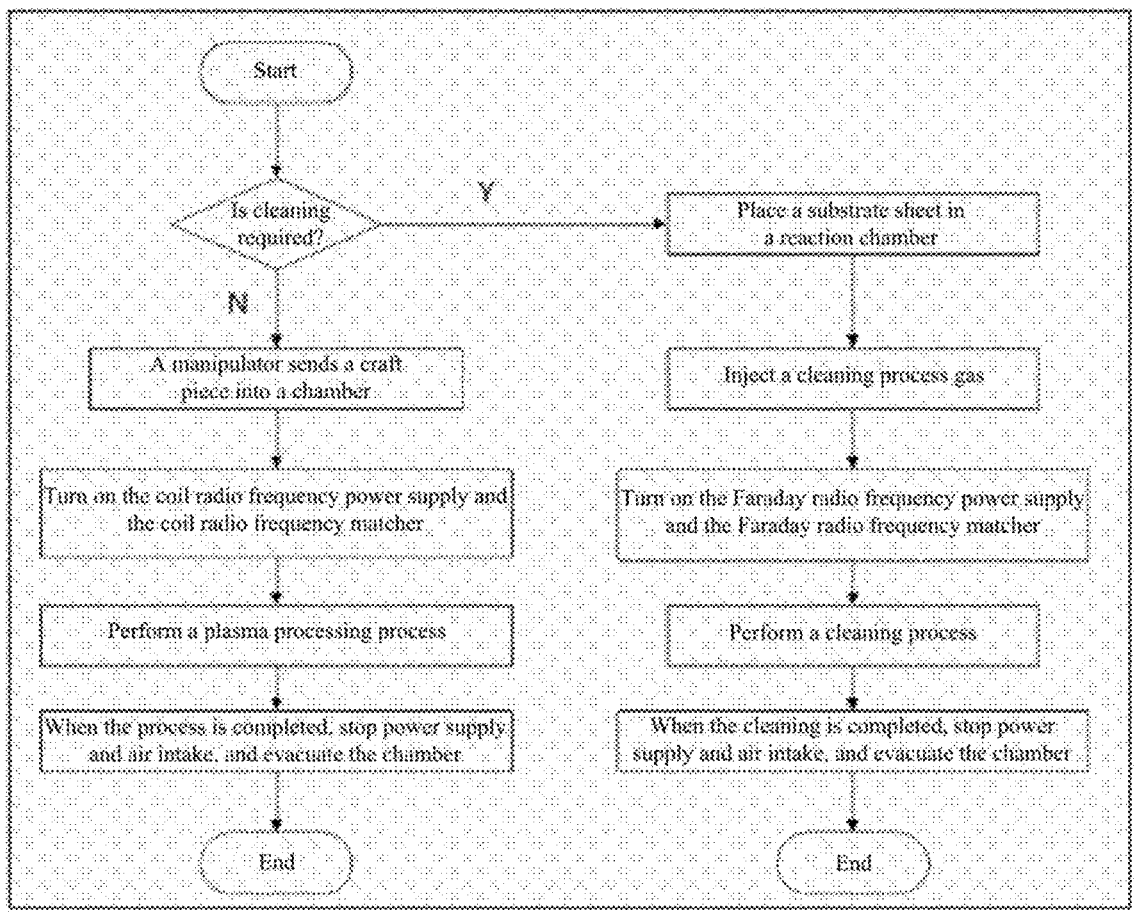
FIG. 11 is a working flowchart of a third implementation in a faraday cleaning device and a plasma processing system according to the present invention.

A third implementation of the present invention is shown in FIG. 10. A process and cleaning flowchart of this implementation is shown in FIG. 11. Two radio frequency power supplies and two matchers are configured, one pair of radio frequency power supply and matcher for the inner and outer coils alone, the other pair of radio frequency power supply and matcher for the faraday layer 100 alone, and the two pairs do not interfere with each other. When the process starts in the chamber, the coil radio frequency power supply is turned on, a faraday radio frequency power supply is turned off. The coil matcher loads radio frequency power into the coils at the center and the edge of the vertical coil 80 through a power distribution box, ionizing a process gas in the chamber to form plasma for etching. When the process ends, cleaning of the chamber starts, the coil radio frequency power supply is turned off, and the faraday radio frequency power supply is turned on, to load all radio frequency power to the faraday layer 100, ionizing a cleaning gas in the upper part of the chamber to form active plasma to completely clean the reaction chamber 1, especially a lower surface of the coupling window 10, thereby making the present invention more practicable.

The basic principles and main features of the present invention and the advantages of the present invention are shown and described above. For those skilled in the art, it is apparent that the present invention is not limited to the details of the foregoing exemplary embodiments, and that the present invention can be implemented in other specific forms without departing from the spirit or basic features of the present invention. Therefore, the embodiments should be regarded as exemplary and non-limiting in every respect, and the scope of the present invention is defined by the appended claims rather than the above description. Therefore, all changes falling within the meaning and scope of equivalent elements of the claims should be included in the present invention. Any reference numerals in the claims should not be considered as limiting the claims involved.

In addition, it should be understood that although this specification is described in accordance with the implementations, not each implementation includes only one independent technical solution. Such narration in this specification is merely for clarity. Those skilled in the art should regard this specification as a whole. The technical solutions in each embodiment can also be properly combined to form other implementations understandable by those skilled in the art.

What is claimed is:

1. A faraday cleaning device, comprising a reaction chamber, a bias electrode, a wafer, a chamber cover, and an clean mechanism, wherein the chamber cover is mounted on an upper end face of the reaction chamber, the bias electrode is mounted inside the reaction chamber, the wafer is mounted on an upper end face of the bias electrode, and the clean mechanism is provided on an upper side of the chamber cover; and the clean mechanism comprises a coupling window, an air inlet nozzle, a vertical coil, and a faraday layer, the coupling window is mounted on an upper end face of the chamber cover, the air inlet nozzle is mounted inside the coupling window, the faraday layer is mounted on an upper end face of the coupling window, and the vertical coil is mounted on an upper end face of the faraday layer, wherein the faraday layer comprises a two-stage faraday or a three-stage faraday, wherein the two-stage faraday comprises a center faraday, a edge faraday, a faraday capacitor, and a faraday electrode sheet, the faraday capacitor and faraday electrode sheet are stacked in this order at a gap between the center faraday and the edge faraday, and wherein the three-stage faraday comprises an internal faraday, a central faraday, an external faraday, an internal capacitor, an internal electrode sheet, an external capacitor, and an external electrode sheet, the internal capacitor and internal electrode sheet are stacked in this order at a first gap between the internal faraday and the central faraday, and the external capacitor and external electrode sheet are stacked in this order at a second gap between the central faraday and the external faraday.

2. The faraday cleaning device according to claim 1, wherein an outermost diameter of the two-stage faraday is 0% to 10% greater than a maximum diameter of the coupling window exposed in the chamber cover, a maximum diameter of the center faraday accounts for 40% to 65% of the two-stage faraday, and a size of the faraday electrode sheet of the two-stage faraday is the same as a size of the faraday capacitor and a thickness of the faraday electrode sheet is the same as a thickness of each of the center faraday and the edge faraday.

3. The faraday cleaning device according to claim 2, wherein a thickness of the faraday capacitor, a size of a superimposed part of the center faraday and the edge faraday, and the gap between the center faraday and the edge faraday are calculated by the following capacitance calculation formula: $C=\varepsilon S/4\pi kd$, wherein c is a constant, S is a facing area of a capacitor plate, d is a distance of the capacitor plate, and k is an electrostatic force constant; and for a common parallel plate capacitor, a capacitance is $C=\varepsilon S/d$ (wherein c is a dielectric constant of a dielectric between plates, S is a plate area, and d is a distance between the plates).

4. The faraday cleaning device according to claim 3, wherein the center faraday of the two-stage faraday consists of two identical sets of sector conductive members, there is a gap between the sector conductive members, the sector conductive members each comprise a conductive ring and petal-like assemblies with a gap therebetween, the petal-like assemblies are isolated from each other, the petal-like assemblies are uniformly distributed and rotationally symmetrical about a vertical axis, and the gaps between the petal-like assemblies are of a same shape and size.

5. The faraday cleaning device according to claim 1, wherein an outermost diameter of the three-stage faraday is 0% to 10% greater than a maximum diameter of the coupling window exposed in the chamber cover, a maximum diameter of the internal faraday accounts for 15% to 35% of the three-stage faraday, a range of the central faraday accounts for 15% to 35% of the three-stage faraday, and sizes of the internal electrode sheet and the external electrode sheet of the three-stage faraday are respectively the same as sizes of the internal capacitor and the external capacitor and thicknesses of the internal electrode sheet and the external electrode sheet are the same as thicknesses of the internal faraday, the central faraday, and the external faraday.

6. The faraday cleaning device according to claim 5, wherein thicknesses of the internal capacitor and the external capacitor, and a size of a superimposed part with each of the internal faraday, the central faraday, and the external faraday, and the first and second gaps between the internal faraday, the central faraday, and the external faraday are calculated by the following capacitor calculation formula: $C=\varepsilon S/4\pi kd$, wherein c is a constant, S is a facing area of a capacitor plate, d is a distance of the capacitor plate, and k is an electrostatic force constant; and for a common parallel plate capacitor, a capacitance is $C=\varepsilon S/d$ (wherein c is a dielectric constant of a dielectric between plates, S is a plate area, and d is a distance between the plates).

* * * * *